(12) United States Patent
Kasumi

(10) Patent No.: US 8,951,031 B2
(45) Date of Patent: Feb. 10, 2015

(54) IMPRINTING APPARATUS AND ARTICLE MANUFACTURING METHOD

(75) Inventor: Kazuyuki Kasumi, Utsunomiya (JP)

(73) Assignee: Canon Kabushiki Kaisha, Tokyo (JP)

(*) Notice: Subject to any disclaimer, the term of this patent is extended or adjusted under 35 U.S.C. 154(b) by 155 days.

(21) Appl. No.: 12/546,442

(22) Filed: Aug. 24, 2009

(65) Prior Publication Data

US 2010/0052217 A1    Mar. 4, 2010

(30) Foreign Application Priority Data

Aug. 26, 2008    (JP) ................................ 2008-216984

(51) Int. Cl.
| | | |
|---|---|---|
| *B29C 43/58* | (2006.01) | |
| *B82Y 10/00* | (2011.01) | |
| *B82Y 40/00* | (2011.01) | |
| *G03F 7/00* | (2006.01) | |
| *B28B 17/00* | (2006.01) | |
| *G03F 9/00* | (2006.01) | |

(52) U.S. Cl.
    CPC .............. *B29C 43/58* (2013.01); *B82Y 10/00* (2013.01); *B82Y 40/00* (2013.01); *G03F 7/0002* (2013.01); *B29C 2043/5808* (2013.01); *B29C 2043/5833* (2013.01); *G03F 9/00* (2013.01)
    USPC ............ 425/149; 425/150; 425/170; 425/171

(58) Field of Classification Search
    USPC .......................... 425/149, 150, 170, 171, 419
    See application file for complete search history.

(56) References Cited

U.S. PATENT DOCUMENTS

| | | | | |
|---|---|---|---|---|
| 4,995,799 | A * | 2/1991 | Hayashi et al. | 425/111 |
| 7,050,248 | B1 * | 5/2006 | Wang | 360/16 |
| 7,338,275 | B2 * | 3/2008 | Choi et al. | 425/385 |
| 7,448,862 | B2 * | 11/2008 | Kokubo et al. | 425/174.4 |
| 7,636,999 | B2 * | 12/2009 | Choi et al. | 29/559 |
| 7,648,354 | B2 * | 1/2010 | Kokubo et al. | 425/174.4 |

(Continued)

FOREIGN PATENT DOCUMENTS

| | | | |
|---|---|---|---|
| JP | 2004-288811 | | 10/2004 |
| JP | 2007-200953 | A | 8/2007 |

(Continued)

OTHER PUBLICATIONS

Science, vol. 272, S.Y.Chou, et.al., p. 85-87, Apr. 5, 1996.

*Primary Examiner* — Atul P. Khare
(74) *Attorney, Agent, or Firm* — Canon U.S.A., Inc. IP Division

(57) ABSTRACT

The imprint apparatus presses resin disposed on a substrate and a mold to each other to form a resin pattern on the substrate. The apparatus includes a driving device configured to move the mold and the substrate relatively to apply a pressing force between the mold and the resin, a measuring device configured to measure a position of at least one of the mold and the substrate, a detector configured to detect the pressing force, and a controller configured to control the driving device. The controller is configured to control the driving device using the position as a controlled variable in a first period, and to control the driving device using the pressing force as a controlled variable in a second period after the first period.

8 Claims, 9 Drawing Sheets

(56) References Cited

U.S. PATENT DOCUMENTS

| | | | |
|---|---|---|---|
| 2004/0192041 A1* | 9/2004 | Jeong et al. | 438/689 |
| 2005/0064054 A1* | 3/2005 | Kasumi | 425/112 |
| 2005/0275125 A1* | 12/2005 | Kawakami et al. | 264/40.5 |
| 2006/0192928 A1* | 8/2006 | Kasumi et al. | 355/30 |
| 2006/0279004 A1* | 12/2006 | Suehira et al. | 257/797 |
| 2007/0145639 A1* | 6/2007 | Seki et al. | 264/293 |
| 2007/0262049 A1* | 11/2007 | Miyajima et al. | 216/11 |
| 2008/0093339 A1* | 4/2008 | Kasumi et al. | 216/54 |

FOREIGN PATENT DOCUMENTS

| | | |
|---|---|---|
| JP | 2007-305895 A | 11/2007 |
| KR | 10-2007-0042478 A | 4/2007 |

* cited by examiner

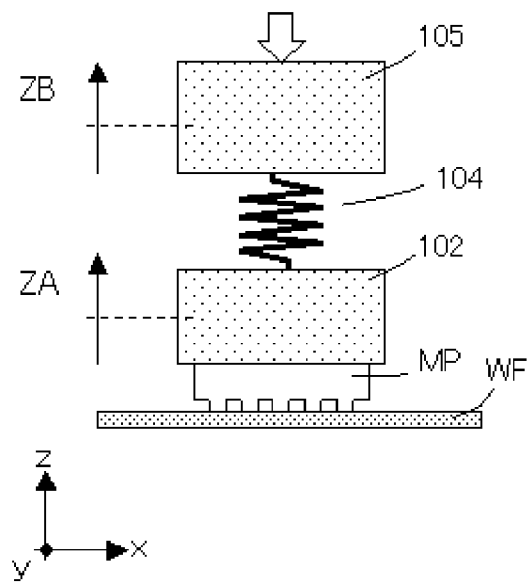 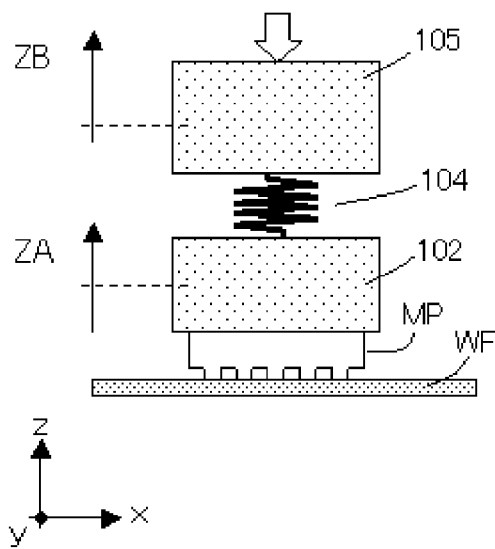
FIG. 3A	FIG. 3B
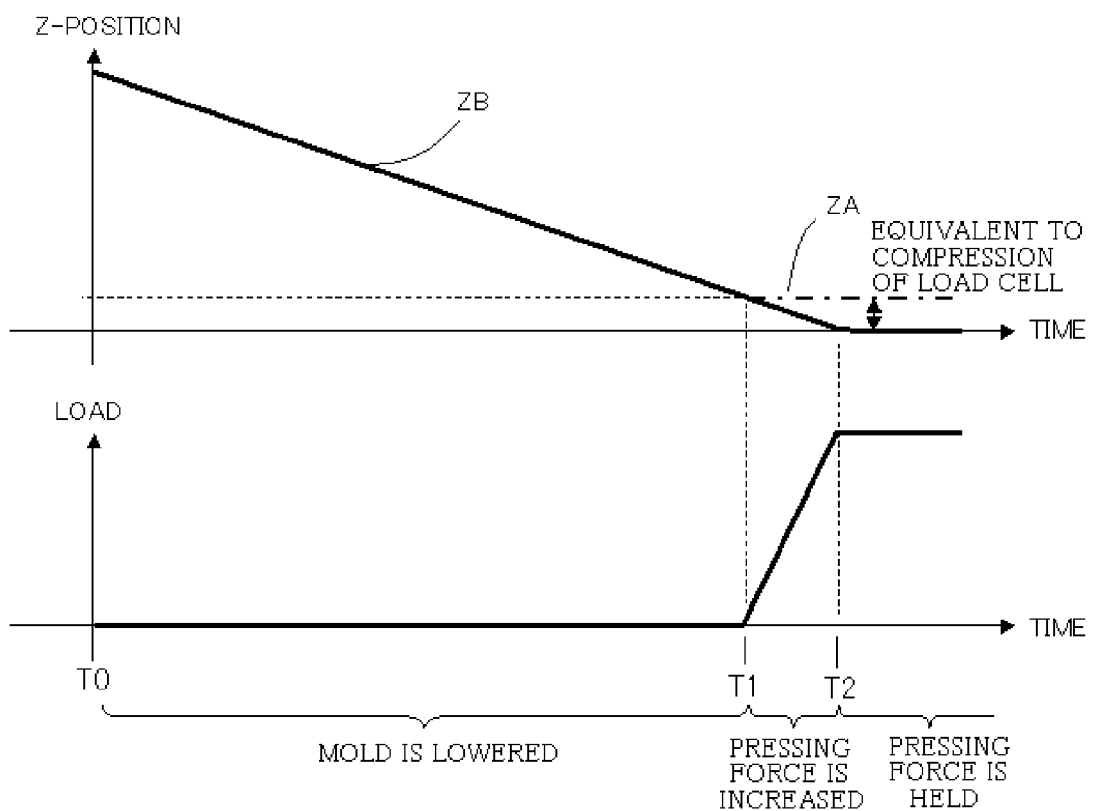
FIG. 4

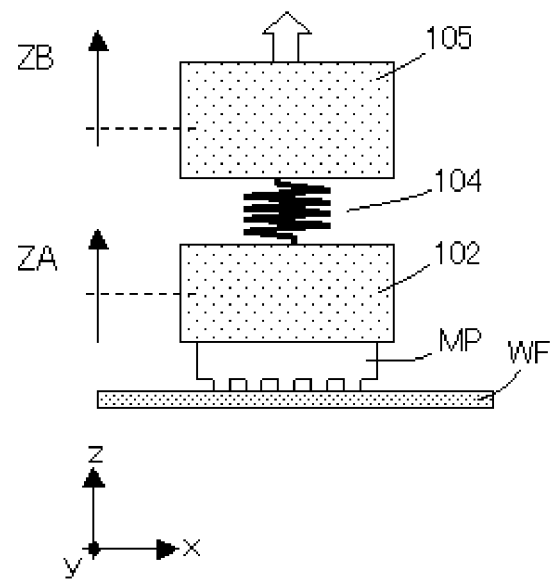
FIG. 5
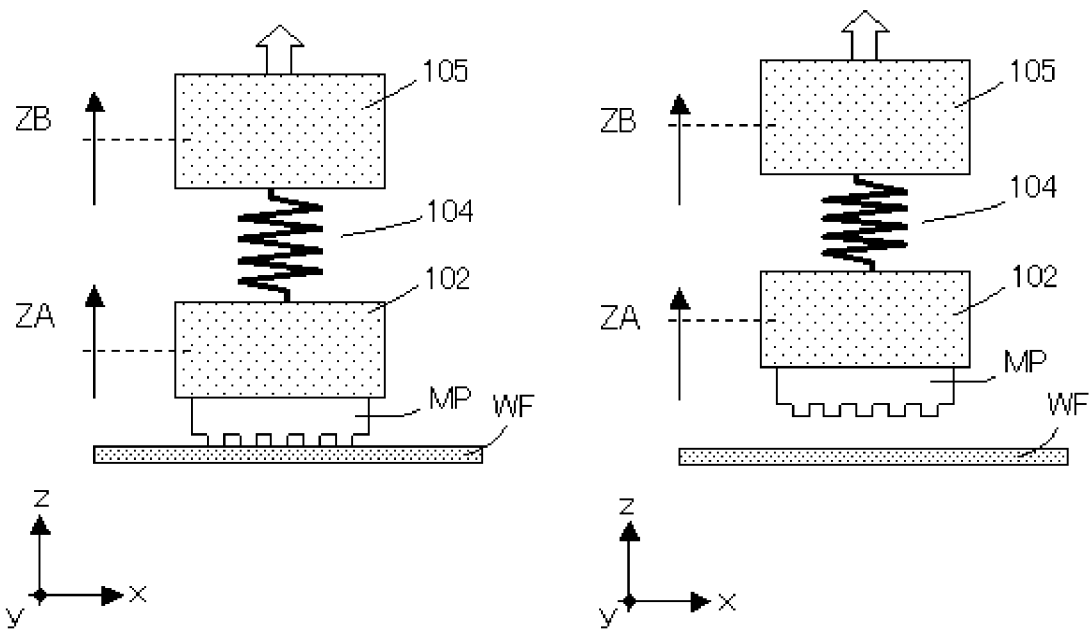
FIG. 6A
FIG. 6B

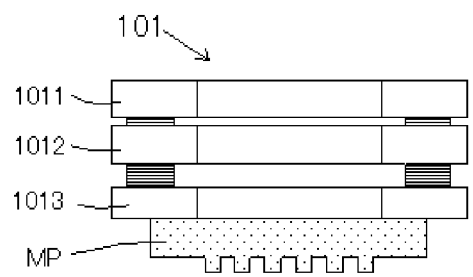
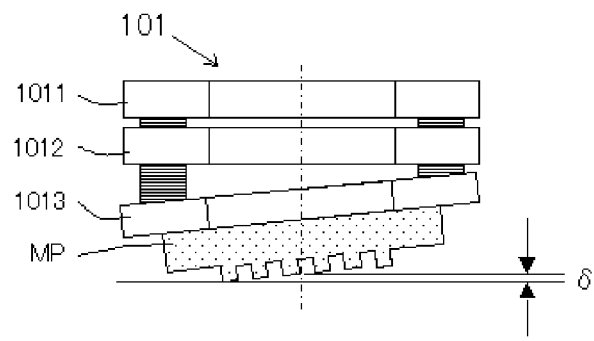
FIG. 11A        FIG. 11B
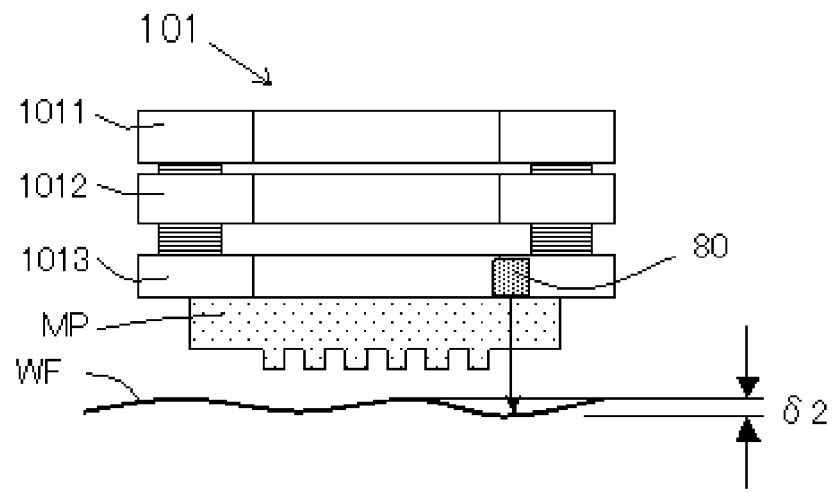
FIG. 12

IMPRINTING APPARATUS AND ARTICLE MANUFACTURING METHOD

BACKGROUND OF THE INVENTION

The present invention relates to an imprint technique (a so-called nano-imprint technique) in which a resin disposed on a substrate and a mold are pressed to each other to form a resin pattern on the substrate.

The nano-imprinting technique enables transferring of even a microscopic pattern of about 10 nm, which is used for manufacturing various devices including a semiconductor chip such as an IC or a LSI, a display element such as a liquid crystal panel, a detection element such as a magnetic head, and an image pickup element such as a CCD (refer to p. 85 to 87, Science, vol. 272, by S. Y. Chou, et. Al., Apr. 5, 1996).

The nano-imprinting technique includes a thermal cycle method and an optical curing (UV curing) method. The thermal cycle method heats a resin (thermoplastic resin) to a glass transition temperature or more to increase fluidity of the resin, and releases the mold from the resin after cooling in a pressed state of the mold to the resin. The optical curing method irradiates an ultraviolet (UV)-curable resin with ultraviolet (UV) light through a transparent mold in a pressed state of the mold to the UV-curable resin to cure the UV-curable resin, and then releases the mold from the cured resin.

Such a nano-imprinting technique is desired to take a shorter time for a mold pressing (stamping) step. Japanese Patent Laid-Open No. 2004-288811 discloses a technique for increasing fluidity of a resin by ultrasonically vibrating a mold to lower viscosity of the resin when the mold is pressed to the resin, and facilitating spreading of the resin to even microscopic concave portions of a pattern within a short time.

Further, in the mold pressing step, a load applied on the mold (that is, a pressing force applied between the mold and the resin) has to be maintained constant. This is because dimensional accuracy of a pattern transferred to the resin is reduced when the load varies. In Japanese Patent Laid-Open No. 2004-288811, however, there is no mention of such load control.

The mold pressing step is subdivided into a step of moving one of the mold and the resin close to the other from a position where the mold is separated from the resin to a position where they come into contact with each other, and a step of controlling a load of pressing the mold to the resin to be constant.

To quicken the mold pressing step, if a moving speed of the mold or the resin (substrate) is simply increased in the former step, a large shock is generated at a moment when the mold comes into contact with the resin. Even in a case where the mold and the resin are brought into contact with each other in parallel, if viewed microscopically, an apex of one of the mold and the resin comes into point-contact with the other, which may cause destruction of the mold by the shock.

Moreover, in the nano-imprinting by the UV-curing method, the mold is made of glass such as quartz which transmits UV light, and vulnerable to shocks. Thus, in the mold pressing step, the mold has to be slowly brought close to the resin, which increases the time necessary for the mold pressing step.

SUMMARY OF THE INVENTION

The present invention provides, for example, an imprint apparatus advantageous in throughput.

The present invention provides as one aspect thereof an imprint apparatus for pressing resin disposed on a substrate and a mold to each other to form a resin pattern on the substrate. The apparatus includes a driving device configured to move the mold and the substrate relatively to apply a pressing force between the mold and the resin, a measuring device configured to measure a position of at least one of the mold and the substrate, a detector configured to detect the pressing force, and a controller configured to control the driving device. The controller is configured to control the driving device using the position as a controlled variable in a first period, and to control the driving device using the pressing force as a controlled variable in a second period after the first period.

The present invention provides as another aspect thereof a method of manufacturing an article. The method includes the steps of pressing resin disposed on a substrate and a mold to each other to form a resin pattern on the substrate using an imprint apparatus, and processing the substrate on which the resin pattern has been formed to manufacture the article. The imprint apparatus includes a driving device configured to move the mold and the substrate relatively to apply a pressing force between the mold and the resin, a measuring device configured to measure a position of at least one of the mold and the substrate, a detector configured to detect the pressing force, and a controller configured to control the driving device. The controller is configured to control the driving device using the position as a controlled variable in a first period, and to control the driving device using the pressing force as a controlled variable in a second period after the first period.

Other aspects of the present invention will become apparent from the following description and the attached drawings.

BRIEF DESCRIPTION OF THE DRAWINGS

FIGS. 3A and 3B respectively show the first and second mold driving devices at a wafer contact time and at a mold pressing time in the molding pressing step.

FIG. 4 shows changes in drive amount and load of a first and second mold driving devices in a conventional molding pressing step.

FIG. 5 shows the first and second mold driving devices at a start time of mold releasing in a mold releasing step.

FIGS. 6A and 6B respectively show the first and second mold driving devices in a middle of and at a completion time of mold releasing in the mold releasing step.

FIGS. 11A and 11B show a method for setting a mold stage and a control switching position in the first embodiment.

FIG. 12 shows another method for setting the control switching position in the first embodiment.

DESCRIPTION OF THE EMBODIMENTS

Exemplary embodiments of the present invention will hereinafter be described with reference to the accompanying drawings.

[First Embodiment]

Figure 1:
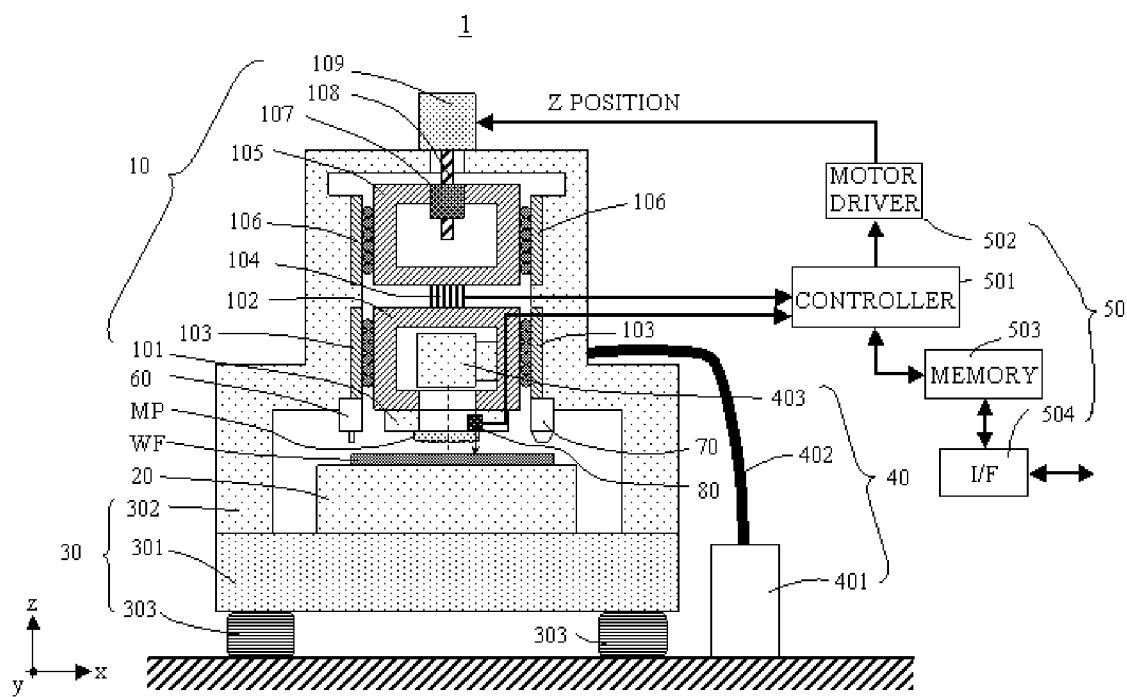
FIG. 1 schematically shows a configuration of an imprinting apparatus that is a first embodiment of the present invention.
Figure 2:
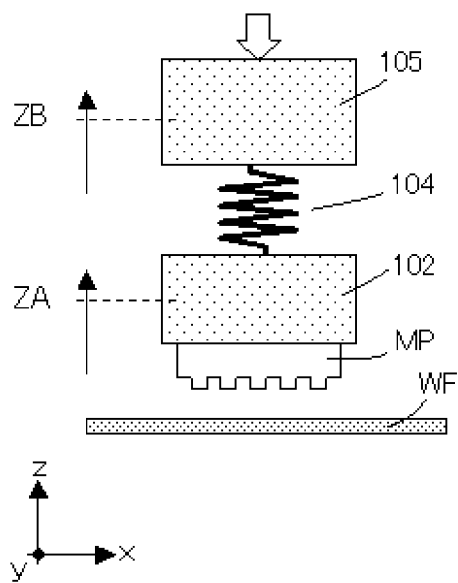
FIG. 2 shows first and second mold driving devices at a start time of mold driving in a mold pressing step.

FIGS. 1 and 2 show a configuration of an imprinting apparatus that is a first embodiment of the present invention. The imprinting apparatus 1 of the present embodiment is a nano-imprinting apparatus which brings a mold (die) MP having a concave-convex pattern formed thereon and a UV (ultraviolet)-curable resin as a liquid or a viscous liquid disposed on a waver WF as a substrate into press-connect with each other to transfer the pattern to the UV-curable resin. The imprinting apparatus 1 of the present embodiment is a step-and-repeat imprinting apparatus.

Hereinafter, the wafer WF and the UV-curable resin disposed on the wafer WF are collectively referred to as "wafer WF" for descriptive purposes.

The imprinting apparatus 1 includes a mold pressing mechanism (driving device) 10 for moving the mold MP in a vertical direction (in a Z direction) to press it to the wafer WF, a wafer stage 20 for moving the waver WF frontward, backward, leftward and rightward (in an XY direction), and a structural body 30 for supporting the entire imprinting apparatus 1. The imprinting apparatus 1 includes an illumination system 40 for illuminating the UV-curable resin (resist) with UV light, and a control system (controller) 50 for controlling drive of the mold pressing mechanism 10. The imprinting apparatus 1 includes a dispenser 60 for dispensing (applying) the UV-curable resin on the wafer WF. The imprinting apparatus 1 further includes an alignment scope 70 for measuring a position of the wafer WF, and a gap measuring device 80 for measuring a gap (or a distance or a relative position) between the mold MP and the wafer WF.

The mold MP is made of a material, such as quartz, which transmits the UV light to cure the UV-curable resin. A three-dimensional concave-convex pattern to be transferred to the UV-curable resin is formed in a bottom surface of the mold MP.

The UV-curable resin is dispensed on a surface of the wafer (substrate) WF by the dispenser 60. The UV-curable resin is a material cured when being irradiated with UV light. The UV-curable resin is a liquid or a viscous liquid before irradiation of the UV light.

The mold pressing mechanism 10 includes a mold stage 101, a first mold driving device 102, a first guide 103, a load sensor (detector) 104, a second mold driving device 105, a second guide 106, a ball nut 107, a ball screw 108, and a motor 109. The mold pressing mechanism 10 drives the motor 109 to rotate the ball screw 108 so as to integrally move the second mold driving device 105 connected to the ball nut 107, the load sensor 104 and the first mold driving device 102 in the vertical (Z) direction. The mold MP held by the mold stage 101 connected to the first mold driving device 102 accordingly moves in the Z direction with respect to the wafer WF to come into contact with the wafer WF, and applies a pressing force between the mold MP and the wafer WF.

This embodiment describes a case where the mold MP as a drive target is moved in the Z direction with respect to the static wafer WF to be pressed to the wafer WF. However, the wafer WF as a drive target may be moved in the Z direction with respect to a static mold MP to be pressed to the mold MP.

The mold stage 101 holds the mold MP. The mold stage 101 has a structure which permits, when the mold MP comes into contact with the wafer WF, changing of a posture of the mold MP such that the mold MP and the wafer WF are maintained parallel to each other to match a surface of the mold MP on which the concave-convex pattern is formed (hereinafter referred to as "pattern surface") with a surface of the wafer WF. Hereinafter, such posture changing is referred to as "swinging", and a mechanism which permits the swinging is referred to as "swinging mechanism". The mold stage 101 has an opening formed at its center. The opening can pass the UV light to cure the UV-curable resin.

The first mold driving device 102 is configured to be movable in the Z direction. A top of the first mold driving device 102 is connected to the load sensor 104.

The first guide 103 forms a guiding mechanism for guiding movement of the first mold driving device 102 in the Z direction, and uses a rolling mechanism such as a ball, a roller or a bearing. Although in this embodiment a bearing is used for the first guide 103, an air guide may be used.

The load sensor 104 has a function of detecting a load applied thereon. In this embodiment, a load cell is used as the load sensor 104. The load sensor 104 detects a load corresponding to a pressing force applied between the mold MP and the wafer WF when the mold MP is pressed to the wafer WF or a tensile force applied between the mold MP and the wafer WF when the mold MP is released from the wafer WF. The load corresponding to the pressing force is one of values relating to the pressing force.

A detection result (detected value) of the load sensor 104 is input to the control system 50 that controls drive of the mold pressing mechanism 10 (i.e., the mold MP). A top of the load sensor 104 is connected to the second mold driving device 105.

The second mold driving device 105 is configured to be movable in the Z direction as in the case of the first mold driving device 102. A top of the second mold driving device 105 is connected to the ball nut 107. The second mold driving device 105 is moved in the Z direction by rotation of the ball screw 108 engaged with the ball nut 107.

The second guide 106 forms a guiding mechanism for guiding movement of the second mold driving device 105 in the Z direction as in the case of the first guide 103.

The motor 109 is connected to the ball screw 108. The motor 109 rotates the ball screw 108, which in turn causes movement of the ball nut 107 engaged with the ball screw 108, the second mold driving device 105 connected to the ball nut 107, the load sensor 104 and the first mold driving device 102 in the Z direction.

The wafer stage 20 holds the wafer WF, and controls a position of the wafer WF in the XY direction or a posture thereof. The wafer stage 20 moves in a stepping manner in the X or Y direction when sequentially transferring the pattern of the mold MP to the wafer WF. A position and a posture of the wafer stage 20 are highly accurately controlled based on a measuring result of a laser interferometer (not shown).

The structural body 30 includes a surface plate 301, a frame 302 and a vibration isolator 303. The surface plate 301 supports the wafer stage 20 and the frame 302. The surface plate 301 is mounted on a floor via the vibration isolator 303. The vibration isolator 303 blocks vibrations from the floor. The vibration isolator 303 includes an air damper.

The illumination system 40 includes a lamp box 401, an optical fiber 402 and an illumination optical system 403. The UV light used for curing the UV-curable resin is generated by a high-pressure mercury lamp disposed in the lamp box 401, and is introduced to the illumination optical system 403 via the optical fiber 402. The illumination optical system 403 adjusts an irradiation field angle and an irradiation intensity distribution of the UV light to project the UV light through the mold MP onto the UV-curable resin dispensed on the wafer WF.

The illumination optical system 403 is disposed in the first mold driving device 102. The illumination optical system 403 includes, for example, a plurality of lens units for making an illumination intensity distribution uniform, and a mirror for reflecting the UV light to be projected onto the UV-curable resin dispensed on the wafer WF through an opening formed at a lower part of the first mold driving device 102.

The control system 50 includes a controller 501, a motor driver 502, a memory 503 and an interface unit 504 to control the mold pressing mechanism 10 that drives the mold MP in the Z direction. The controller 501 performs calculation processing based on the detected value of the load sensor 104 to output a drive signal to the motor driver 502. The motor driver 502 drives the motor 109 according to the drive signal from the controller 501. The interface unit 504 communicates data with the outside such as inputting of control parameters to the control system 50. The memory 503 stores various data such as the control parameters.

The dispenser 60 is a mechanism for dispensing the UV-curable resin which is a resist on the wafer WF by dropping the UV-curable resin to an area (transferring area) on the wafer WF to which the pattern of the mold MP is transferred. In a case where the UV-curable resin is beforehand dispensed on the entire wafer WF by spin-coating or the like, the dispenser 60 can be omitted.

The alignment scope 70 is supported by the frame 302, and detects an alignment mark provided on the wafer WF when the pattern of the mold MP is transferred to the wafer WF. The alignment scope 70 is used for aligning the mold MP with the wafer WF.

The gap measuring device 80 is installed in the mold stage 101 to measure a distance (gap) between the mold MP and the wafer WF. The gap measuring device 80, for example, projects light onto the wafer WF to detect an intensity spectrum of its reflected light, and refers to a database showing a relationship between the intensity spectrum and the distance to obtain the distance (refer to Japanese Patent Laid-Open No. 2008-008889).

Next, description will be made of operations of the imprinting apparatus 1 thus configured. First, a mold conveying system (not shown) conveys the mold MP into the imprinting apparatus 1 to attach it to the mold stage 101. A measuring system (not shown) measures a posture of the pattern surface of the mold MP. Then, the mold stage 101 is driven based on a result of measurement by the measuring system to move the mold MP to a reference posture. The reference posture is, for example, a posture parallel to a scanning direction (XY plane) of the wafer stage 20.

Next, a wafer conveying system (not shown) conveys the wafer into the imprinting apparatus 1. The alignment scope 70 detects the alignment mark formed on the wafer WF, and positions the wafer WF on the wafer stage 20 based on a result of detection by the alignment scope 70.

Figures 19A, 19B, 19C:
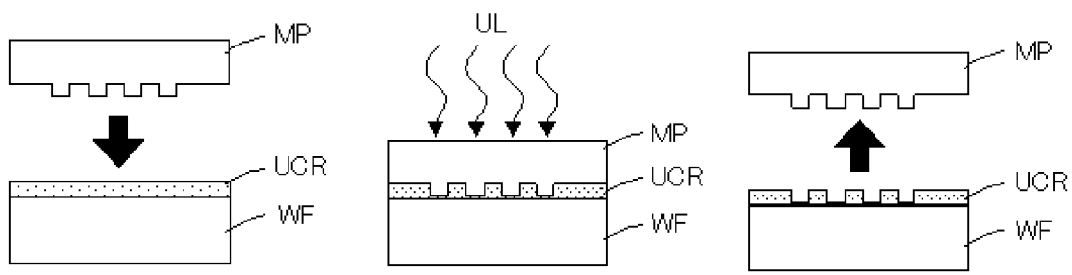
FIGS. 19A to 19C schematically show a nano-imprinting process performed by an optical curing method in each of the embodiments.

Next, the pattern of the mold MP is sequentially transferred to the wafer WF. As shown in FIGS. 19A to 19C, a transferring operation includes (a) a mold pressing step, (b) a curing step and (c) a mold releasing step.

In the mold pressing step, the dispenser 60 drops a UV-curable resin UCR to the area of the wafer WF to which the pattern of the mold MP is transferred. Then, the wafer WF is positioned directly below the mold MP, and the mold pressing mechanism 10 is driven to press the mold MP to the wafer WF. Thus, the UV-curable resin UCR flows along the pattern surface (that is, the concave-convex pattern) of the mold MP.

FIGS. 2, 3A and 3B schematically show motions of the first mold driving device 102, the load sensor 104 and the second mold driving device 105 in the mold pressing step. Reference character ZA denotes a position of the first mold driving device 102 in the Z direction (hereinafter referred to as "Z position"), and reference character ZB denotes a Z position of the second mold driving device 105. The load sensor 104 is a load cell as described above. The load cell has a spring therein, and detects a load by converting an expanding/compressing amount of the spring into the load when a tensile load or a compressing load is applied thereon.

FIG. 2 shows a start time of the mold pressing step. In FIG. 2, the first mold driving device 102 is suspended from the second mold driving device 105 via the load sensor 104. In this state, actually, weights of the first mold driving device 102 and the mold MP are applied as loads on the load sensor 104. However, the controller 501 recognizes the load applied on the load sensor 104 to be 0 in this case. In this state, the mold MP is separated from the wafer WF. A relative position of the mold MP which is a drive target and the wafer WF corresponds to a first relative position.

FIG. 3A shows a state where the mold pressing step is started to lower the second mold driving device 105, and the mold MP is in contact with the wafer WF. A relative position of the mold MP and the wafer WF in this state corresponds to a second relative position.

FIG. 3B shows a state where the second mold driving device 105 is further lowered from the state shown in FIG. 3A such that the mold MP is pressed to the wafer WF (that is, a state where a pressing force is applied between the mold MP and the wafer WF). Although the first mold driving device 102 and the mold MP are not basically moved from the positions shown in FIG. 3A, the second mold driving device 105 is lowered by an amount equivalent to a compression amount of the load sensor 104. The load sensor 104 outputs a detection value corresponding to the pressing force applied between the mold MP and the wafer WF.

Description will be made of operations of the respective components in the mold pressing step. A graph in an upper part of FIG. 4 shows motions of the first mold driving device 102 and the second mold driving device 105 in a conventional mold pressing step. The motion of the second mold driving device 105 corresponds to a drive signal from the controller 501 (that is, a drive command from the control system 50). A graph in a lower part of FIG. 4 shows changes in pressing force (load) according to the motions of the first mold driving device 102 and the second mold driving device 105.

In the graph in the upper part of FIG. 4, a vertical axis indicates Z positions of the first mold driving device 102 and the second mold driving device 105, and a horizontal axis indicates time. As described above, reference character ZA denotes the Z position of the first mold driving device 102, and reference character ZB denotes the Z position of the second mold driving device 105. The Z positions of the first mold driving device 102 and the second mold driving device 105 are shown with reference to a position at which a mold releasing step described below is started.

In the graph in the lower part of FIG. 4, a vertical axis indicates a load corresponding to the load detected by the load sensor 104), and a horizontal axis indicates time. The time axis in the graph in the lower part of FIG. 4 is identical to that in the graph in the upper part thereof.

In FIG. 4, the mold MP is gradually lowered from a state where the mold MP is separated from the wafer WF (from a time T0 to a time T1), and then comes into contact with the wafer WF at the time T1. Further lowering of the second mold driving device 105 from the time T1 increases the load (pressing force) while the first mold driving device 102 is kept stopped. When the load reaches a predetermined load at a time T2, the lowering of the second driving device 105 is stopped. The mold pressing step is accordingly completed.

Thus, the mold pressing mechanism 10 which controls the positions of the first mold driving device 102, the second mold driving device 105 and the ball screw 108 to generate the pressing force needs an element (spring function) for converting a displacement (drive amount) into a load. In this embodiment, the load sensor 104 serves as the element for converting the displacement into the load. In a case where the element for converting the displacement into the load is constituted by a member having extremely high rigidity, even an extremely small displacement (drive amount in the Z direction) causes a large change in load, which considerably deteriorates controllability.

FIG. 4 shows only the motions of the components in the conventional mold pressing step. The mold pressing step in this embodiment will be described below in detail.

After the completion of the mold pressing step, the curing step is started. As shown in FIG. 19B, in the curing step, in a state where the mold MP is pressed to the wafer WF, the UV-curable resin UCR dispensed on the wafer WF is irradiated with the UV light to be cured.

After the completion of the curing step, the mold releasing step is started. As shown in FIG. 19C, in the mold releasing step, the mold pressing mechanism 10 drives the mold MP in a direction to separate the mold MP from the wafer WF to release the mold MP from the UV-curable resin UCR. The mold releasing step will be described below in detail.

After the completion of the pattern transferring performed in the above-described way, a replica pattern identical in shape to the pattern of the mold MP (however, the concave/convex relationship is reversed) is formed in the UV-curable resin. Then, the wafer stage 20 is driven and a UV-curable resin is dropped in a next transferring area on the wafer WF. After that, the wafer WF is moved to the position for transferring the pattern to repeat the mold pressing step, the curing step and the mold releasing step.

Referring to FIGS. 5, 6A and 6B, the mold releasing step will be described. FIGS. 5, 6A and 6B schematically show motions of the first mold driving device 102, the load sensor 104, and the second mold driving device 105 in the mold releasing step.

FIG. 5 shows a state at a start time of the mold releasing step, which is identical to the state at the completion time of the mold pressing step. In this state, the second mold driving device 105 is moved (lowered) in the Z direction to compress the load sensor 104.

When the second mold driving device 105 is moved upward from this state, as shown in FIG. 6A, even if the second mold driving device 105 reaches a position higher than the position where the mold MP came into contact with the wafer WF in the mold pressing step shown in FIG. 3A, the mold MP is not separated from the wafer WF. This is because the cured UV-curable resin on the wafer WF serves as an adhesive, and thereby an adhesive force is provided between the mold MP and the wafer WF.

When the second mold driving device 105 is further moved upward, as shown in FIG. 6B, a tensile force applied between the mold MP and the wafer WF separates the mold MP from the wafer WF. In other words, the tensile force applied between the mold MP and the wafer WF larger than the adhesive force applied therebetween separates the mold MP from the wafer WF.

FIG. 4 shows a motion of the second mold driving device 105 in the conventional mold pressing step when a lowering speed (moving speed) of the second mold driving device 105 is almost constant. In the conventional mold pressing step, the motor 109 is driven such that the load detected by the load sensor 104 increases to a predetermined target load.

Figure 7:
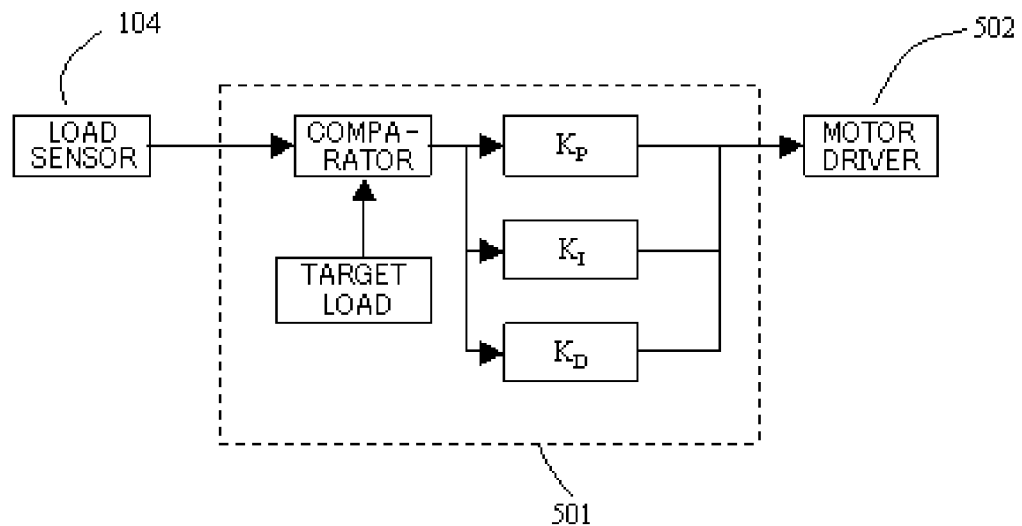
FIG. 7 is a block diagram showing a configuration of a controller in the first embodiment.
Figure 8:
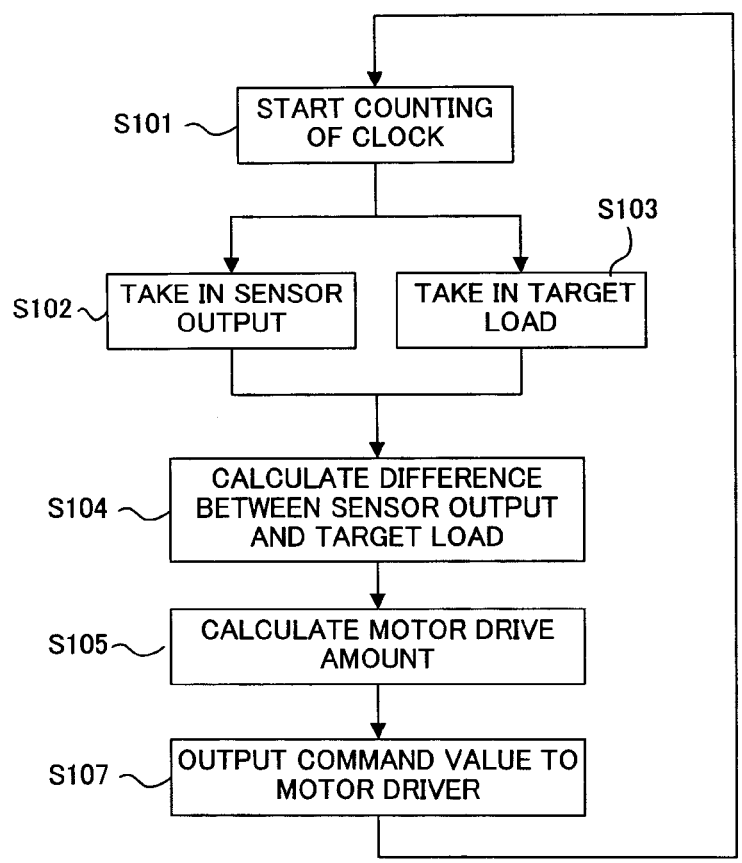
FIG. 8 shows a conventional control flowchart.

FIG. 7 shows a configuration of the controller 501. FIG. 8 shows a conventional control flowchart of the controller 501.

At step S101, the controller 501 starts counting of a clock (time). At step S102, the controller 501 takes in the output (detected load) of the load sensor 104. At steps S103 and S104, the controller 501 calculates a difference between the detected load of the load sensor 104 and the target load. At steps S105 and S107, the controller 501 calculates a drive amount of the motor 109 by PID control based on the difference calculated at step S104 to output a command value to the motor driver 502.

If the second mold driving device 105 is driven at a high speed, shocks are generated instantly when the mold MP comes into contact with the surface of the wafer WF. The mold MP is made of quartz which transmits the UV light, so that it may be destroyed by the shocks. Therefore, in the conventional mold pressing step, a command value (gain) of a drive amount of the motor 109 corresponding to the above-described difference is set very small, thereby lowering the second mold driving device 105 at a very low speed. In other words, a moving speed of the mold MP has to be set small to prevent destruction of the mold MP. As a result, a very long time is necessary for the mold pressing step.

In contrast thereto, in this embodiment, in order to reduce the time necessary for the mol pressing step, drive control of the mold MP is switched between position control (position feedback control) based on the distance (gap) measured by the gap measuring device 80 and load control (load feedback control) based on the load detected by the load sensor 104.

Specifically, the mold MP is moved at a high speed by the position control until the mold MP reaches a position immediately before the mold MP comes into contact with the wafer WF (that is, in a first period from when the relative position of the mold MP and the wafer WF is the first relative position until the relative position thereof becomes a third relative position between the first and second relative positions). After reaching this position (that is, in a second period), the mold MP is moved at a low speed by the load control until the mold MP comes into contact with the wafer WF. The above-described control can reduce the time necessary for the mold pressing step while preventing destruction of the mold MP.

Although this embodiment describes the case where only the mold MP is moved (driven), the wafer WF or both the mold MP and the wafer WF may be moved. In other words, the position control of the mold MP may be performed by position control of at least one of the mold MP and the wafer WF, and the position control of at least one of the mold MP and the wafer WF is referred to as "relative position control of the mold MP and the wafer WF". The load control can be also performed by movement of at least one of the mold MP and the wafer WF.

Figure 9:
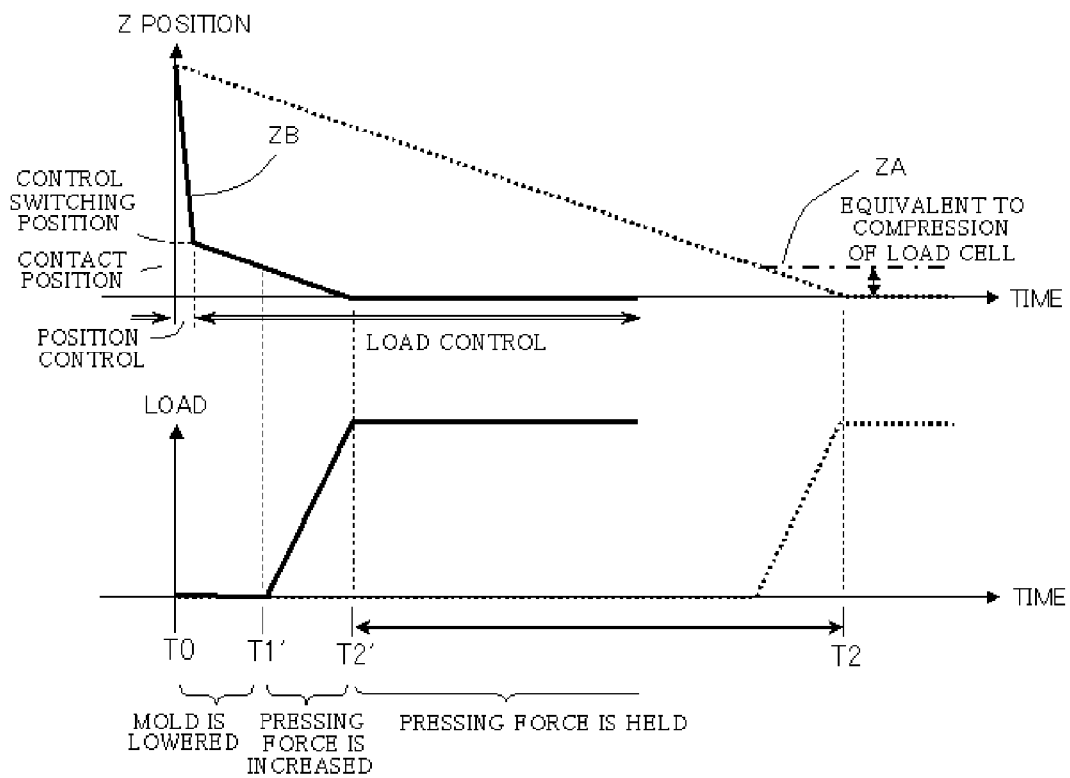
FIG. 9 shows changes in drive amount and load of the first and second mold driving devices in the mold pressing step in the first embodiment.

Referring to FIG. 9, specific description will be made of drive control of the second mold driving device 105 in the mold pressing step in this embodiment.

A graph in an upper part of FIG. 9 shows motions (drive patterns) of the first mold driving device 102 and the second mold driving device 105. The motion of the second mold driving device 105 corresponds to the drive signal from the controller 501 (that is, the drive command from the control system 50). A graph in a lower part of FIG. 9 shows changes in pressing force (load) according to the motions of the first mold driving device 102 and the second mold driving device 105.

In FIG. 9, a solid line (ZB) indicates changes in drive pattern and load (pressing force) of the second mold driving device 105 in this embodiment, and a chain line indicates changes in conventional drive pattern and load shown in FIG. 4. In this embodiment, the load corresponds to the detected load of the load sensor 104. A dashed line (ZA) indicates the drive pattern of the first mold driving device 102. A horizontal axis indicates time. The time axis in the lower graph is identical to that in the upper graph.

The mold pressing step is started after the wafer WF is positioned at its pressing position. First, the gap measuring device 80 measures the distance between the mold MP and the wafer WF. The controller 501 operates the motor 109 based on the measured distance, that is, by an operation amount equivalent to a distance difference (target distance) obtained by subtracting a distance between a control switching position (corresponding to the third relative position) described below and the wafer WF from the measured distance. This operation is equivalent to drive (position control) of the second mold driving device 105 and the mold MP with the control switching position set as a target position. As described above, the control switching position is set to the position immediately before the mold MP comes into contact with the wafer WF (UV-curable resin).

To the control switching position, the second mold driving device 105 and the mold MP are lowered at a speed higher than that in the load feedback control described below. In other words, a relative speed of the mold MP and the wafer WF in the position feedback control (the first period) is higher than that in the load feedback control (the second period). Thus, the drive control in the first period is performed.

After completion of the drive of the second mold driving device 105 and the mold MP to the control switching position, the controller 501 switches the drive control of the second mold driving device 105 to the load feedback control (hereinafter simply referred to as "load control"). That is, the drive control enters the second period. Specifically, the controller 501 whose configuration is shown in FIG. 7 calculates the drive amount of the motor 109 from the difference between the detected load of the load sensor 104 and the target load to output the command value to the motor driver 502. The drive control is performed by the PID control as shown in FIG. 7. Control parameters (Kp, Ki and Kd) are set such that the load control can be appropriately performed and no gain is reduced.

Figure 10:
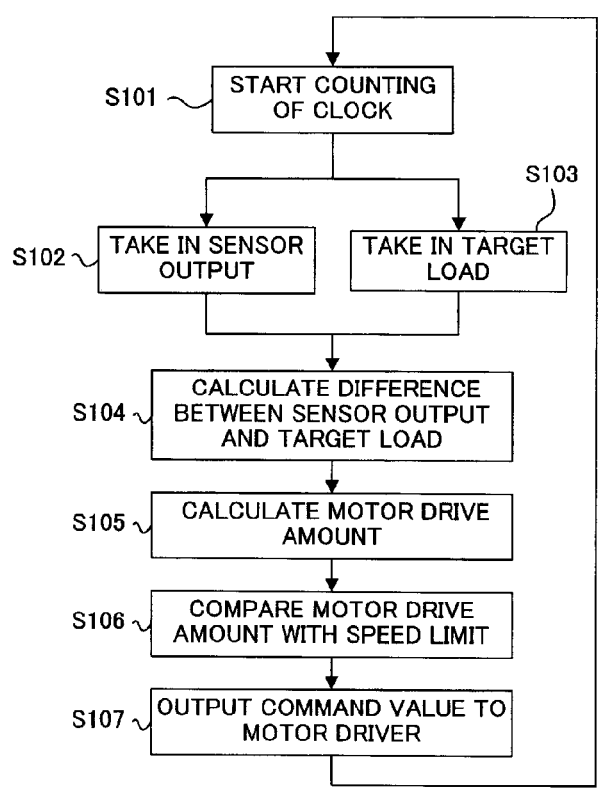
FIG. 10 shows a control flowchart in the first embodiment.

FIG. 10 shows a control flowchart in the above drive control. Steps S101 to S105 are the same as those in the control flowchart shown in FIG. 8. At step S101, the controller 501 starts counting of a clock (time), and at step S102, takes in the output (detected load) of the load sensor 104. At steps S103 and S104, the controller 501 calculates the difference between the detected load of the load sensor 104 and the target load. At step S105, the controller 501 calculates the drive amount of the motor 109 by the PID control based on the difference calculated at step S104.

In this embodiment, at step S106 after step S105, the controller 501 compares the drive amount of the motor 109 calculated in the PID control with a predetermined speed limit. If the calculated drive amount of the motor 109 exceeds the speed limit, the controller 501 at step S107 outputs a command value corresponding to the speed limit to the motor driver 502.

This is because, since immediately after the drive control has been switched to the load control, the mold MP is not in contact with the wafer WF and thus the detected load of the load sensor 104 is 0, if a speed limit is not set, the moving speed of the mold MP increases to collide with the wafer WF at a high speed. Steps S103 to S107 correspond to control steps.

After switching to the load control, the mold MP is lowered at a speed lower than that during the position control, and comes into contact with the wafer WF (UV-curable resin) at a contact position at a time T1'. Then, the motor 109 is further driven to generate the pressing force between the mold MP and the wafer WF. The motor 109 is controlled until the detected load of the load sensor 104 corresponding to the pressing force increases up to the predetermined target load at a time T2'.

As described above, this embodiment moves the second mold driving device 105 and the mold MP to the control switching position (corresponding to the third relative position) which is a position immediately before the mold MP comes into contact with the wafer WF by the position control for driving them from the drive start position (corresponding to the first relative position) to the target position at a high speed. After that, this embodiment switches the drive control to the load control for driving the second mold driving device 105 and the mold MP at a low speed while monitoring the detected load of the load sensor 104 to bring the mold MP into contact with the wafer WF (at the second relative position) and then to increase the pressing force to the target value (predetermined value).

This drive control enables reduction of the time necessary for the mold pressing step which moves the second mold driving device 105 from the drive start position and then increases the pressing force to the target value. Moreover, the mold MP is brought into contact with the wafer WF at a low speed, and hence destruction of the mold MP can be prevented.

To perform the mold pressing step within a shorter time, the control switching position should be set as close as possible to the contact position. If too close, however, it is difficult to bring the mold MP into contact with the wafer WF at a sufficiently low speed. Thus, it is important to appropriately set the control switching position. The setting of the control switching position will hereinafter be described.

FIG. 11A shows a structure of the mold stage 101. Reference numeral 1011 denotes a structural part of the mold stage 101, the structural part 1011 being connected to the first mold driving device 102. Reference numeral 1012 denotes a mold tilt stage which is a base for permitting a posture change of a swinging mechanism 1013 described below.

The swinging mechanism 1013 is connected to the mold tilt stage 1012 so as to freely change its posture. The swinging mechanism 1013 is connected to the mold tile stage 1012 via an elastic member, which allows the swinging mechanism 1013 to freely change its posture by receiving an external force.

The pattern surface of the mold MP is basically aligned in parallel with the surface (wafer surface) of the wafer WF with reference to the mold tile stage 1012. When the pattern surface is actually brought into contact with the wafer surface, a portion where they are not completely in parallel with each other is absorbed by the posture change of the swinging mechanism 1013. This makes it possible to bring the mold MP into contact with the wafer WF in a state where the pattern surface is completely parallel to the wafer surface.

FIG. 11B shows a state where the swinging mechanism 1013 is at one end of its posture change stroke. In this state, the end of the mold MP protrudes downward by δ as compared with a center (indicated by a dashed line) of the mold MP. When the gap measuring device 80 performs distance measurement at the center of the mold MP, δ is expressed as follows:

δ=(a stroke of the swinging mechanism)×(a distance from the center of the pattern surface to a position thereof farthest from the center).

The posture change stroke of the swinging mechanism 1013 is about 0.5 mrad. When the pattern surface is 25 mm square, δ is 10 μm. The control switching position shown in FIG. 9 has to be set to a position separated upward by 10 μm or more from the contact position. It is preferable that the control switching position be set at a position away twice as much as δ from the contact position.

Another method for setting the control switching position will hereinafter be described. As shown in FIG. 12, the wafer surface is microscopically wavy, and the distance measured by the gap measuring device 80 is not always indicative of a shortest distance between the mold MP and the wafer WF. When flatness of the wafer surface (difference between a highest position and a lowest position) is δ2, the control switching position should be away by δ2 or more from the contact position. It is preferable that the control switching position be set at a position whose height from the contact position is about double the flatness of the wafer surface.

The flatness of the wafer surface may be measured by a measuring instrument installed in the imprinting apparatus 1, or a guaranteed value of flatness of a wafer used in the imprinting apparatus 1 may be used as the flatness of the wafer surface. When processing for stacking plural layers of patterns on one wafer is performed as in the case of a semiconductor wafer, information of the flatness of the wafer surface is often obtained in advance. For example, if patterning is performed in advance by an optical exposure apparatus (a stepper or a scanner), it is necessary to know the height of the wafer surface in order to measure a focus position. In this case, measurement data of the optical exposure apparatus may be stored in the memory 503 via the interface unit 504, and the control switching position may be set based on the data.

Although the gap measuring device 80 is mounted on the imprinting apparatus 1 in this embodiment to measure the distance between the mold MP and the wafer WF, a ranging sensor such as a capacitance sensor may be mounted on the dispenser which drops the UV-curable resin onto the wafer WF, and a distance to the wafer surface may be measured simultaneously when the UV-curable resin is dispensed.

[Second Embodiment]

Figure 13:
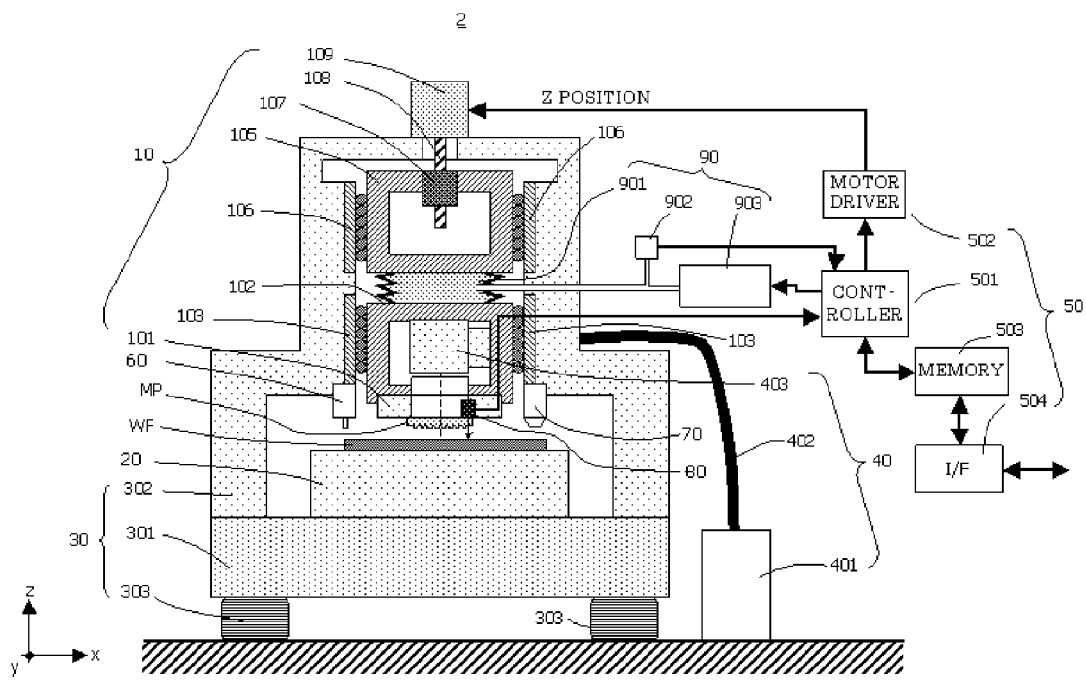
FIG. 13 schematically shows a configuration of an imprinting apparatus that is a second embodiment of the present invention.

FIG. 13 shows a configuration of an imprinting apparatus 2 which is a second embodiment of the present invention. The basic configuration of the imprinting apparatus 2 is the same as that of the imprinting apparatus 1 of the first embodiment. In FIG. 13, components identical in function to those in the first embodiment are denoted by the same reference numerals, and description thereof will be omitted.

The imprinting apparatus 2 of the second embodiment is different from that of the first embodiment in that a pressure control system 90 is installed. The pressure control system 90 includes a container 901, a pressure sensor 902 and a pressure controller 903. The container 901 is expanded and contracted by pressure therein, which is disposed between a first mold driving device 102 and a second mold driving device 105. The pressure sensor 902 measures pressure in the container 901, and the pressure controller 903 controls the pressure.

Figure 15:
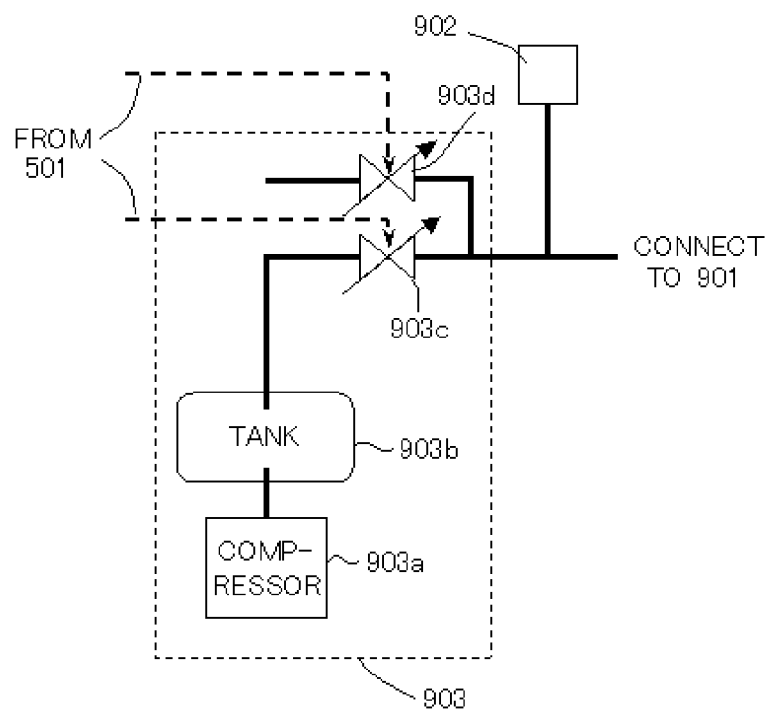
FIG. 15 is a block diagram showing a configuration of a pressure controller in the second embodiment.

FIG. 15 shows a configuration of the pressure controller 903. The pressure controller 903 includes a compressor 903a, a tank 903b to which the compressor 903a is connected and two valves 903c and 903d. Positive pressure is maintained in the tank 903b by the compressor 903a. The valve 903c is disposed in the midway of a main pipe laid from the tank 903b to the container 901. The valve 903d opens and closes a sub-pipe for releasing the main pipe to the atmosphere. Opening and closing the valves 903c and 903d enable control of the pressure in the container 901.

Figure 14:
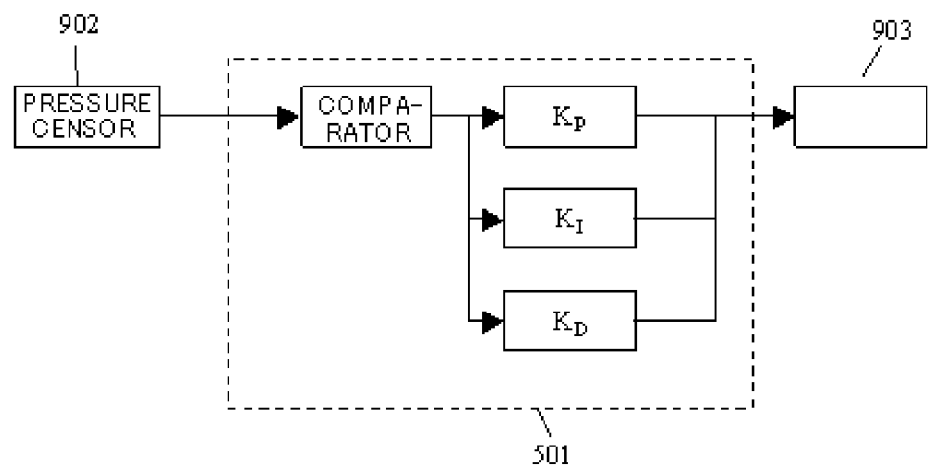
FIG. 14 is a block diagram showing a configuration of a controller in the second embodiment.

As shown in FIG. 14, a controller 501 outputs a command to control the opening and closing of the valves 903c and 903d based on the pressure detected by the pressure sensor 902. The pressure detected by the pressure sensor 902 is a value relating to a pressing force between a mold MP to a wafer WF.

According to this embodiment, the control of the pressure in the container 901 enables control of the pressing force of the mold MP to the wafer WF. The control of the pressure can easily prevent an excessive pressing force from being generated between the mold MP and the wafer WF as compared with the case of controlling the pressing force only by driving the ball screw in the first embodiment.

Figure 16:
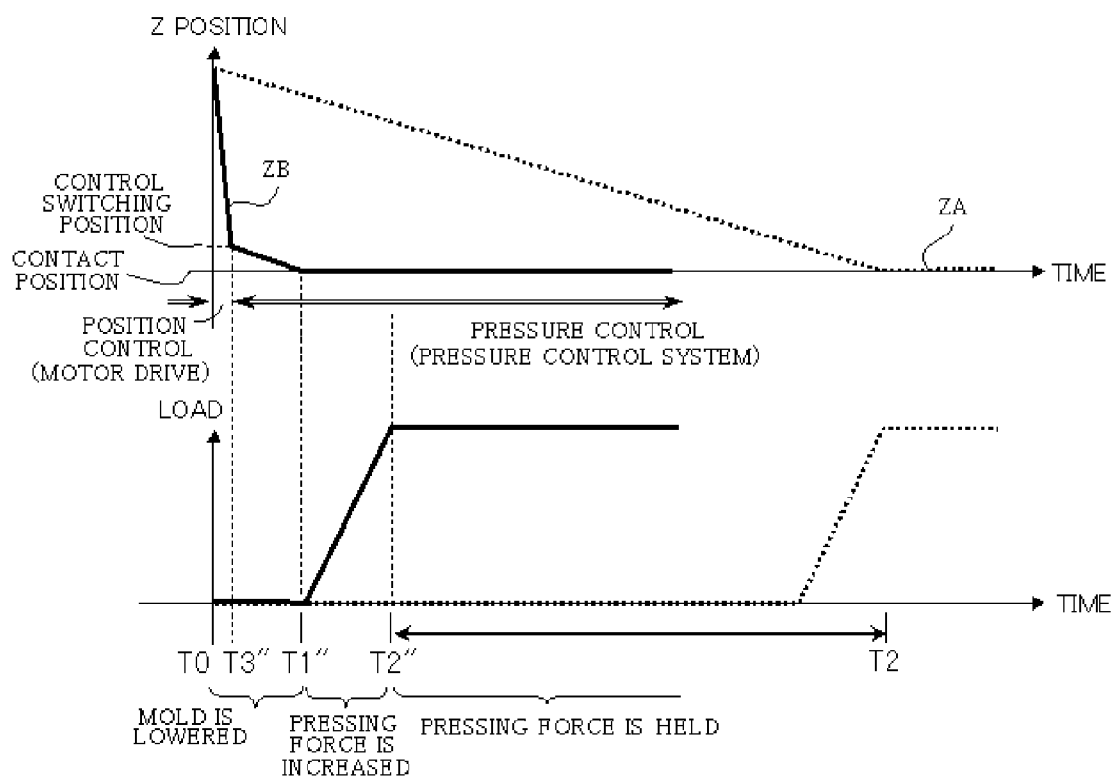
FIG. 16 shows changes in drive amount and load of first and second mold driving devices in a mold pressing step in the second embodiment.

Referring to FIG. 16, drive control of the second mold driving device 105 in a mold pressing step in this embodiment will specifically be described. A graph in an upper part of FIG. 16 shows motions (drive patterns) of the first and second mold driving devices 102 and 105. The motion of the second mold driving device 105 corresponds to a drive signal from the controller 501 (that is, a drive command from a control system 50). A graph in a lower part of FIG. 16 shows changes in pressing force (load) according to the motions of the first and second driving devices 102 and 105.

In FIG. 16, a solid line (ZB) indicates changes in drive pattern and load of the second mold driving device 105 in this embodiment, and a chain line indicates changes in conventional drive pattern and load shown in FIG. 4. In this embodiment, the load corresponds to the pressure detected by the pressure sensor 902. A dashed line (ZA) indicates the drive pattern of the first mold driving device 102.

The mold pressing step is started after the wafer WF is positioned at a pressing position. First, a gap measuring device 80 measures a distance between the mold MP and the wafer WF. The controller 501 operates a motor 109 based on the measured distance by an operation amount corresponding to the distance difference described in the first embodiment from a drive start position (corresponding to a first relative position at a time T0). The second mold driving device 105 and the mold MP are accordingly lowered to a control switching position (corresponding to a third relative position) as a target position at a high speed. The control switching position is set as in the case of the first embodiment.

After completion of the drive of the second mold driving device 105 and the mold MP to the control switching position at a time T3", the controller 501 switches the drive control of the second mold driving device 105 to pressure control. Specifically, the controller 501 activates the pressure controller 903 to cause it to open the valve 903c such that the pressure in the container 901 is increased to a target pressure (target value). The target pressure corresponds to a target value (target load) of the pressing force applied between the mold MP and the wafer WF.

The opening of the valve 903c sends compressed air into the container 901 and thereby a volume of the container 901 is increased, which lowers the second mold driving device 105 at a speed lower than the moving speed thereof to the control switching position. After the mold MP comes into contact with the wafer WF at a time T1", the pressing force is generated therebetween and then increased as the pressure in the container 901 is increased. When the pressure in the container 901 (that is the pressure detected by the pressure sensor 902) reaches the target pressure, the mold pressing step is completed.

As described above, the second embodiment moves the second mold driving device 105 and the mold MP to the control switching position (corresponding to the third relative position) which is a position immediately before the mold MP comes into contact with the wafer WF by the position control for driving them from the drive start position (corresponding to the first relative position) to the target position at a high speed. After that, this embodiment switches the drive control to the pressure control (in other words, load control) for driving the second mold driving device 105 and the mold MP at a low speed while monitoring the detected pressure of the pressure sensor 902 to bring the mold MP into contact with the wafer WF (at the second relative position) and then to increase the pressing force to the target value (predetermined value). This drive control enables reduction of a time necessary for the mold pressing step which moves the second mold driving device 105 from the drive start position and then increases the pressing force to the target value. Moreover, the mold MP is brought into contact with the wafer WF at a low speed, and therefore destruction of the mold MP can be prevented.

[Third Embodiment]

Figure 17:
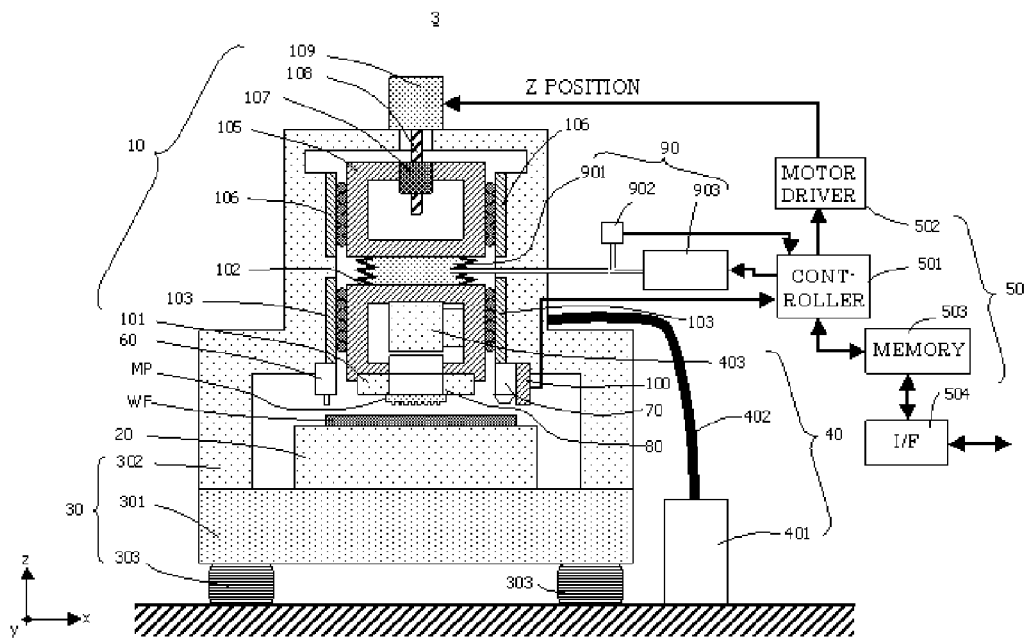
FIG. 17 schematically shows a configuration of an imprinting apparatus that is a third embodiment of the present invention.

FIG. 17 shows a configuration of an imprinting apparatus 3 which is a third embodiment of the present invention. The basic configuration of the imprinting apparatus 3 is the same as that of the imprinting apparatus 2 of the second embodiment. In FIG. 17, components identical in function to those in the second embodiment are denoted by the same reference numerals, and description thereof will be omitted.

The imprinting apparatus 3 of this embodiment does not include the gap measuring device described in the first embodiment, but includes a wafer height sensor 100. Although operations in a mold pressing step in this embodiment is basically the same as those in the second embodiment, this embodiment is different from the second embodiment in that a control switching position is determined by using a detection result of the wafer height sensor 100.

After a wafer WF is conveyed into the imprinting apparatus 3, the wafer height sensor 100 measures a height of a surface (wafer surface) of the wafer WF to store the measured height to a memory 503. This embodiment measures the height of the wafer surface in each transferring area, and changes the control switching position based on the measured height.

Specifically, after the wafer WF is conveyed into the imprinting apparatus 3, a wafer stage 20 is driven to move (scan) the wafer WF with respect to the wafer height sensor 100, and the height of the wafer surface is measured to detect a concave-convex shape of the wafer surface.

Figure 18:
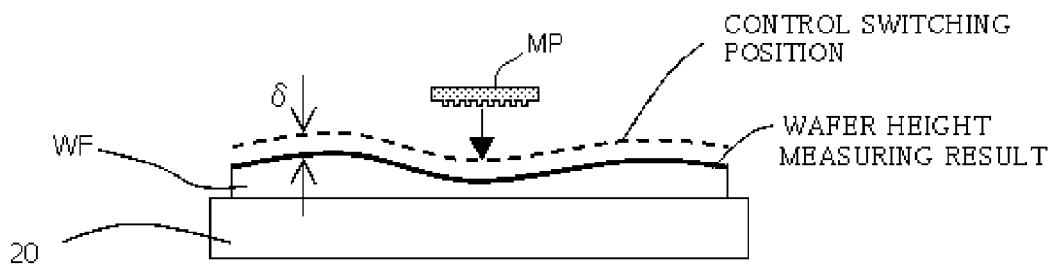
FIG. 18 shows a method for setting a control switching position by using a wafer height sensor in the third embodiment.

Thus, as shown in FIG. 18, on the imprinting apparatus 3, a height (surface position) of each area of the wafer surface on which the mold MP is pressed can be measured. Then, a height position obtained by adding the value δ described in the first embodiment to the height of the wafer surface is set as a control switching position for each area. Thereby, the control switching position can be appropriately set (changed) for each transferring area of the wafer WF.

[Fourth Embodiment]

In each of the above-described embodiments, the gap measuring device 80 or the wafer height sensor 100 is used to set the control switching position. In contrast thereto, in a fourth embodiment of the present invention, the control switching position is set without using them.

Specifically, in a case where pattern transferring processes are performed to plural areas of one wafer, a mold is brought into contact with the wafer at an extremely low speed in a first pattern transferring process. The contact of the mold with the wafer is detected by monitoring a change in detected value of the load sensor 104 described in the first embodiment. Then, a contact position (height) at which the mold comes into contact with the wafer is stored in a memory.

In subsequent pattern transferring processes, a height position obtained by adding the value δ described in the first embodiment to the stored contact position is set as the control switching position.

This method does not need to directly measure the distance between the mold and the wafer, so that no gap measuring device 80 is required. Further, this method does not need to detect a height of a wafer surface in advance, and therefore the configuration of the imprinting apparatus can be simplified.

Although each of the above embodiments have described the nano-imprinting apparatus using the UV-curing method, the present invention can be applied to an imprinting apparatus using the thermal cycle method.

[Fifth Embodiment]

Description will be made of an article manufacturing method of the present invention as a fifth embodiment thereof. The method for manufacturing articles such as a semiconductor integrated circuit element and a liquid crystal display element includes a step of transferring (forming) a pattern on a substrate such as a wafer, a glass plate and a film-like substrate by using the imprinting apparatus described in each of the first to fourth embodiments. Further, the method can include a step of etching the substrate on which the pattern has been transferred. In a case where the method is used to manufacture other articles such as a patterned medium (storage medium) and an optical element, the method can include another processing step of processing the substrate on which the pattern has been transferred instead of the etching step, The article manufacturing method of the present invention is more advantageous in at least one of performance, quality, productivity and production cost of devices than conventional article manufacturing methods.

Furthermore, the present invention is not limited to these embodiments and various variations and modifications may be made without departing from the scope of the present invention.

This application claims the benefit of Japanese Patent Application No. 2008-216984, filed on Aug. 26, 2008, which is hereby incorporated by reference herein in its entirety.

What is claimed is:

1. An imprint apparatus for causing a mold to contact a resin disposed on a substrate so as to form a resin pattern on the substrate, the apparatus comprising:
  a driving device configured to move the mold and the substrate relatively so as to apply a pressing force between the mold and resin;
  a measuring device configured to measure a position of at least one of the mold and the substrate in a direction in which the driving device moves the mold and substrate relatively to apply the pressing force;
  a detector configured to detect the pressing force; and
  a controller configured to control the driving device, wherein the controller is configured to switch from a position control operating during a first time period based on the measured position to a load control operating during a second time period based on the detected pressing force, the first time period ending immediately before the mold comes into contact with the resin, the second time period continuing through contact between the mold and resin, and the load control configured to limit a controller output to the driving device so as not to exceed a predetermined limit during the second period and so that a relative speed between the mold and substrate in the direction in which the driving device moves the mold and substrate relatively is lowered as a result of said switching to not be greater than a predetermined relative speed limit.

2. An apparatus according to claim 1, wherein the measuring device is configured to measure a distance between the mold and the substrate as the position.

3. An apparatus according to claim 1, wherein the detector includes a pressure sensor or a load cell, the pressure sensor being configured to sense a gas pressure.

4. An apparatus according to claim 1, wherein the driving device includes a container, a gas pressure in the container being controlled by the controller so as to control the pressing force.

5. An apparatus according to claim 4, wherein the controller is configured to control the gas pressure during the second period.

6. An apparatus according to claim 4, wherein the container is configured to be expanded and contracted by the gas pressure.

7. An apparatus according to claim 4, wherein the detector includes a pressure sensor configured to sense the gas pressure.

8. An apparatus according to claim 1, wherein the position control and the load control operate by feedback control.

* * * * *